(12) United States Patent
Chen et al.

(10) Patent No.: US 10,529,757 B2
(45) Date of Patent: Jan. 7, 2020

(54) CMOS IMAGE SENSOR INCLUDING PIXELS WITH READ CIRCUITRY HAVING A SUPERLATTICE

(71) Applicant: ATOMERA INCORPORATED, Los Gatos, CA (US)

(72) Inventors: Yi-Ann Chen, Campbell, CA (US); Abid Husain, San Jose, CA (US); Hideki Takeuchi, San Jose, CA (US)

(73) Assignee: ATOMERA INCORPORATED, Los Gatos, CA (US)

( * ) Notice: Subject to any disclaimer, the term of this patent is extended or adjusted under 35 U.S.C. 154(b) by 0 days.

(21) Appl. No.: 15/843,077

(22) Filed: Dec. 15, 2017

(65) Prior Publication Data

US 2019/0189658 A1 Jun. 20, 2019

(51) Int. Cl.
| H01L 31/00 | (2006.01) |
| H01L 27/146 | (2006.01) |
| H01L 29/15 | (2006.01) |

(52) U.S. Cl.
CPC .. *H01L 27/14616* (2013.01); *H01L 27/14621* (2013.01); *H01L 27/14627* (2013.01);
(Continued)

(58) Field of Classification Search
CPC ......... H01L 27/14621; H01L 27/14627; H01L 27/14645; H01L 27/14689;
(Continued)

(56) References Cited

U.S. PATENT DOCUMENTS

| 4,937,204 A | 6/1990 | Ishibashi et al. |
| 5,216,262 A | 6/1993 | Tsu |
| (Continued) | | |

FOREIGN PATENT DOCUMENTS

| EP | 1644984 | 4/2006 |
| GB | 2347520 | 6/2000 |
| (Continued) | | |

OTHER PUBLICATIONS

Anonymous "Electrical Simulation Methodology" https://kb.lumerical.com/en/cmos_overview_and_methodology.html: retreived from internet Dec. 28, 2017, pp. 4.
(Continued)

*Primary Examiner* — Robert G Bachner
(74) *Attorney, Agent, or Firm* — Allen, Dyer, Doppelt + Gilchrist, P.A.

(57) ABSTRACT

A CMOS image sensor may include an active pixel sensor array including pixels, each including a photodiode and read circuitry coupled to the photodiode and including transistors defining a 4T cell arrangement. At least one of the transistors may include a first semiconductor layer and a superlattice on the first semiconductor layer including a plurality of stacked groups of layers, with each group including a plurality of stacked base semiconductor monolayers defining a base semiconductor portion, and at least one non-semiconductor monolayer constrained within a crystal lattice of adjacent base semiconductor portions. The transistor(s) may also include a second semiconductor layer on the superlattice, spaced apart source and drain regions in the second semiconductor layer defining a channel therebetween, and a gate comprising a gate insulating layer on the second semiconductor layer and a gate electrode on the gate insulating layer.

17 Claims, 11 Drawing Sheets

(52) U.S. Cl.
CPC .. *H01L 27/14645* (2013.01); *H01L 27/14689* (2013.01); *H01L 29/152* (2013.01)

(58) Field of Classification Search
CPC ........... H01L 27/14685; H01L 27/1461; H01L 27/1463; H01L 27/14647; H01L 29/152; H01L 27/14616; H01L 27/1464; H01L 27/14634; H01L 27/14636; H01L 29/1033; H01L 29/16; H01L 31/109; H01L 27/14692; H01L 31/035254; H01L 31/1804; H01L 27/1469; H01L 31/035236; H01L 21/02164; H01L 21/02532; H01L 27/14643; H01L 29/66568; H01L 27/14614
See application file for complete search history.

(56) References Cited

U.S. PATENT DOCUMENTS

| | | | |
|---|---|---|---|
| 5,357,119 A | 10/1994 | Wang et al. | |
| 5,683,934 A | 11/1997 | Candelaria | |
| 5,796,119 A | 8/1998 | Seabaugh | |
| 6,141,361 A | 10/2000 | Mears et al. | |
| 6,376,337 B1 | 4/2002 | Wang et al. | |
| 6,472,685 B2 | 10/2002 | Takagi | |
| 6,741,624 B2 | 5/2004 | Mears et al. | |
| 6,830,964 B1 | 12/2004 | Mears et al. | |
| 6,833,294 B1 | 12/2004 | Mears et al. | |
| 6,878,576 B1 | 4/2005 | Mears et al. | |
| 6,891,188 B2 | 5/2005 | Mears et al. | |
| 6,897,472 B2 | 5/2005 | Mears et al. | |
| 6,927,413 B2 | 8/2005 | Mears et al. | |
| 6,952,018 B2 | 10/2005 | Mears et al. | |
| 6,958,486 B2 | 10/2005 | Mears et al. | |
| 6,993,222 B2 | 1/2006 | Mears et al. | |
| 7,018,900 B2 | 3/2006 | Kreps | |
| 7,033,437 B2 | 4/2006 | Mears et al. | |
| 7,034,329 B2 | 4/2006 | Mears et al. | |
| 7,045,377 B2 | 5/2006 | Mears et al. | |
| 7,045,813 B2 | 5/2006 | Mears et al. | |
| 7,071,119 B2 | 7/2006 | Mears et al. | |
| 7,105,895 B2 | 9/2006 | Wang et al. | |
| 7,109,052 B2 | 9/2006 | Mears et al. | |
| 7,123,792 B1 | 10/2006 | Mears et al. | |
| 7,148,712 B1 | 12/2006 | Prey, Jr. et al. | |
| 7,153,763 B2 | 12/2006 | Hytha et al. | |
| 7,202,494 B2 | 4/2007 | Blanchard et al. | |
| 7,227,174 B2 | 6/2007 | Mears et al. | |
| 7,229,902 B2 | 6/2007 | Mears et al. | |
| 7,265,002 B2 | 9/2007 | Mears et al. | |
| 7,279,699 B2 | 10/2007 | Mears et al. | |
| 7,279,701 B2 | 10/2007 | Kreps | |
| 7,288,457 B2 | 10/2007 | Kreps | |
| 7,303,948 B2 | 12/2007 | Mears et al. | |
| 7,432,524 B2 | 10/2008 | Mears et al. | |
| 7,435,988 B2 | 10/2008 | Mears et al. | |
| 7,436,026 B2 | 10/2008 | Kreps | |
| 7,446,002 B2 | 11/2008 | Mears et al. | |
| 7,446,334 B2 | 11/2008 | Mears et al. | |
| 7,491,587 B2 | 2/2009 | Rao | |
| 7,514,328 B2 | 4/2009 | Rao | |
| 7,517,702 B2 | 4/2009 | Halilov et al. | |
| 7,531,828 B2 | 5/2009 | Mears et al. | |
| 7,531,829 B2 | 5/2009 | Blanchard | |
| 7,531,850 B2 | 5/2009 | Blanchard | |
| 7,586,116 B2 | 9/2009 | Kreps et al. | |
| 7,586,165 B2 | 9/2009 | Blanchard | |
| 7,598,515 B2 | 10/2009 | Mears et al. | |
| 7,612,366 B2 | 11/2009 | Mears et al. | |
| 7,625,767 B2 | 12/2009 | Huang et al. | |
| 7,659,539 B2 | 2/2010 | Kreps et al. | |
| 7,700,447 B2 | 4/2010 | Dukovski et al. | |
| 7,718,996 B2 | 5/2010 | Dukovski et al. | |
| 7,781,827 B2 | 8/2010 | Rao | |
| 7,812,339 B2 | 10/2010 | Mears et al. | |
| 7,863,066 B2 | 1/2011 | Mears et al. | |
| 7,880,161 B2 | 2/2011 | Mears et al. | |
| 7,928,425 B2 | 4/2011 | Rao | |
| 8,389,974 B2 | 3/2013 | Mears et al. | |
| 9,093,363 B2 | 7/2015 | Sukegawa et al. | |
| 9,275,996 B2 | 3/2016 | Mears et al. | |
| 9,406,753 B2 | 8/2016 | Mears et al. | |
| 9,558,939 B1 | 1/2017 | Stephenson et al. | |
| 9,609,213 B2 | 3/2017 | Wakabayashi | |
| 2003/0034529 A1 | 2/2003 | Fitzgerald et al. | |
| 2003/0057416 A1 | 3/2003 | Currie et al. | |
| 2006/0220118 A1 | 10/2006 | Stephenson et al. | |
| 2007/0012910 A1 | 1/2007 | Mears et al. | |
| 2007/0020833 A1 | 1/2007 | Mears et al. | |
| 2007/0158709 A1* | 7/2007 | Mouli | H01L 27/14601 257/291 |
| 2007/0197006 A1* | 8/2007 | Dukovski | H01L 21/0237 438/483 |
| 2008/0012004 A1 | 1/2008 | Huang et al. | |
| 2008/0258134 A1 | 10/2008 | Mears et al. | |
| 2009/0090937 A1* | 4/2009 | Park | H01L 27/14627 257/252 |
| 2010/0178722 A1 | 7/2010 | De Graff et al. | |
| 2011/0215299 A1 | 9/2011 | Rao | |
| 2014/0175592 A1 | 6/2014 | Iwabuchi et al. | |
| 2015/0008482 A1 | 1/2015 | Sato | |
| 2015/0163403 A1 | 6/2015 | Wakabayashi | |
| 2015/0357414 A1 | 12/2015 | Mears | |
| 2016/0088253 A1 | 3/2016 | Tezuka | |
| 2016/0099317 A1 | 4/2016 | Mears et al. | |
| 2016/0149023 A1 | 5/2016 | Mears et al. | |
| 2016/0336406 A1 | 11/2016 | Mears et al. | |
| 2016/0336407 A1 | 11/2016 | Mears et al. | |
| 2016/0358773 A1 | 12/2016 | Mears et al. | |
| 2017/0040371 A1 | 2/2017 | Izuhara | |
| 2017/0294514 A1 | 10/2017 | Mears | |
| 2017/0301757 A1 | 10/2017 | Mears et al. | |
| 2017/0330609 A1 | 11/2017 | Roy | |
| 2018/0240797 A1 | 8/2018 | Yokoyama et al. | |

FOREIGN PATENT DOCUMENTS

| | | |
|---|---|---|
| TW | I528536 | 4/2016 |
| TW | I570901 | 2/2017 |

OTHER PUBLICATIONS

Dragoi et al. "Aligned Fusion Wafer Bonding for CMOS-MEMS and 3D Wafer-Level Integration Applications" Romanian Journal of Information Science and Technology vol. 14, No. 4, 2011, pp. 356-364.

Roger N. Clark "The Canon 7D Mark II Digital Camera Review: Sensor Noise, Thermal Noise, Dynamic Range, and Full Well Analysis" www.clarkvision.com/reviews/evaluation-canon-7dii; retrieved from internet Dec. 28, 2017, pp. 20.

Anonymous "OV12890 Product Guide" http://www.ovt.com/image-sensors/8-13-megapixels; retrieved from Internet Dec. 28, 2017, pp. 2.

Matt Humrich "Camera Phone Technology 101" http://www.tomshardware.com/reviews/camera-phone-technology-101,4287.html#p1; retrieved from internet Dec. 28, 2017, pp. 12.

Turchetta et al. "Introduction to CMOS Image Sensors" http://micro.magnet.fsu.edu/primer/digitalimaging/cmosimagesensors.html; retrieved from internet Dec. 28, 2017, pp. 12.

Lars Rehm "Sony shows off 3-layer stacked smartphone image sensor that can shoot 1000 fps at 1080p" https://www.dpreview.com/news/5696183465/sony-shows-off-3-layer-stacked-smartphone-sensor-that-can-shoot-1000-fps-at-1080p; retrieved from internet Dec. 28, 2017, pp. 2.

R.I. Hornsey "Noise in image sensors" https://ece.uwaterloo.ca/~ece434/Winter2008/Noise.pdf; retrieved from internet Dec. 28, 2017 pp. 86.

U.S. Appl. No. 15/592,464; filed May 11, 2017.
U.S. Appl. No. 15/664,028; filed Jul. 31, 2017.

(56) References Cited

OTHER PUBLICATIONS

U.S. Appl. No. 15/670,231; filed Aug. 7, 2017.
U.S. Appl. No. 15/670,240; filed Aug. 7, 2017.
U.S. Appl. No. 15/670,266; filed Aug. 7, 2017.
U.S. Appl. No. 15/670,274; filed Aug. 7, 2017.
U.S. Appl. No. 15/678,616; filed Aug. 16, 2017.
U.S. Appl. No. 15/678,658; filed Aug. 16, 2017.
U.S. Appl. No. 15/842,981; filed Dec. 15, 2017.
U.S. Appl. No. 15/842,989; filed Dec. 15, 2017.
U.S. Appl. No. 15/842,990; filed Dec. 15, 2017.
U.S. Appl. No. 15/842,993; filed Dec. 15, 2017.
U.S. Appl. No. 15/843,013; filed Dec. 15, 2017.
U.S. Appl. No. 15/843,017; filed Dec. 15, 2017.
U.S. Appl. No. 15/843,044; filed Dec. 15, 2017.
U.S. Appl. No. 15/843,106; filed Dec. 15, 2017.
U.S. Appl. No. 15/843,113; filed Dec. 15, 2017.
U.S. Appl. No. 15/843,121; filed Dec. 15, 2017.
U.S. Appl. No. 15/843,136; filed Dec. 15, 2017.
Luo et al., "Chemical Design of Direct-Gap Light-Emitting Silicon" published in Physical Review Letters, vol. 89, No. 7; Aug. 12, 2002; 4 pgs.
Mears et al. "Simultaneous Carrier Transport Enhancement and variability reduction in Si MOSFETs by insertion of partial Monolayers of oxygen" IEEE silicon Nanoelectronics Workshop (2012): (Date of conference Jun. 10-11, 2012) pp. 2.
Novikov et al. "Silicon-based Optoelectronics" 1999-2003, pp. 1-6.
R. Tsu Phenomena in silicon nanostructure device published online Sep. 6, 2000 by Applied Physics and Materials Science & Processing, pp. 391-402.
Raphael Tsu "Si Based Green ELD: Si-Oxygen Superlattice" wysiwyg://1/http://www3.interscience.wiley.com/cgi-bin/abstract/72512946/start: published online Jul. 21, 2000; 2 pgs. Abstract Only.
Xu et al. "Effectiveness of Quasi-confinement technology for improving P-chanel Si an Ge MOSSFET performance" Department of Electrical Engineering and Computer Science, University of California, Berkeley, 2012, pp. 2. mearstech.net; retrieved from internet Jan. 18, 2016.
Xu et al. "Extension of planar bulk n-channel MOSFET scaling with oxygen insertion technology" IEEE Transactions on Electron devices, vol. 61, No. 9; Sep. 2014. pp. 3345-3349.
Xu et al., "MOSFET performance and scalability enhancement by insertion of oxygen layers", Department of Electrical Engineering and Computer Science, University of California, Berkeley, 2012, pp. 1-4.
Xu et al., "Silicon molecular beam epitaxy: symposium held Apr. 29-May 3, 1991, Anaheim, California, U.S.A.", Silicon Molecular Beam Epitaxy Symposium, Apr. 29-May 3 1991 Anaheim, CA (in: Materials Research Society symposium proceedings), Jan. 1, 1991, pp. 1-2.
Jun. 25, 2019 Office Action in U.S. Appl. No. 15/843,113; Yi-Ann Chen

* cited by examiner

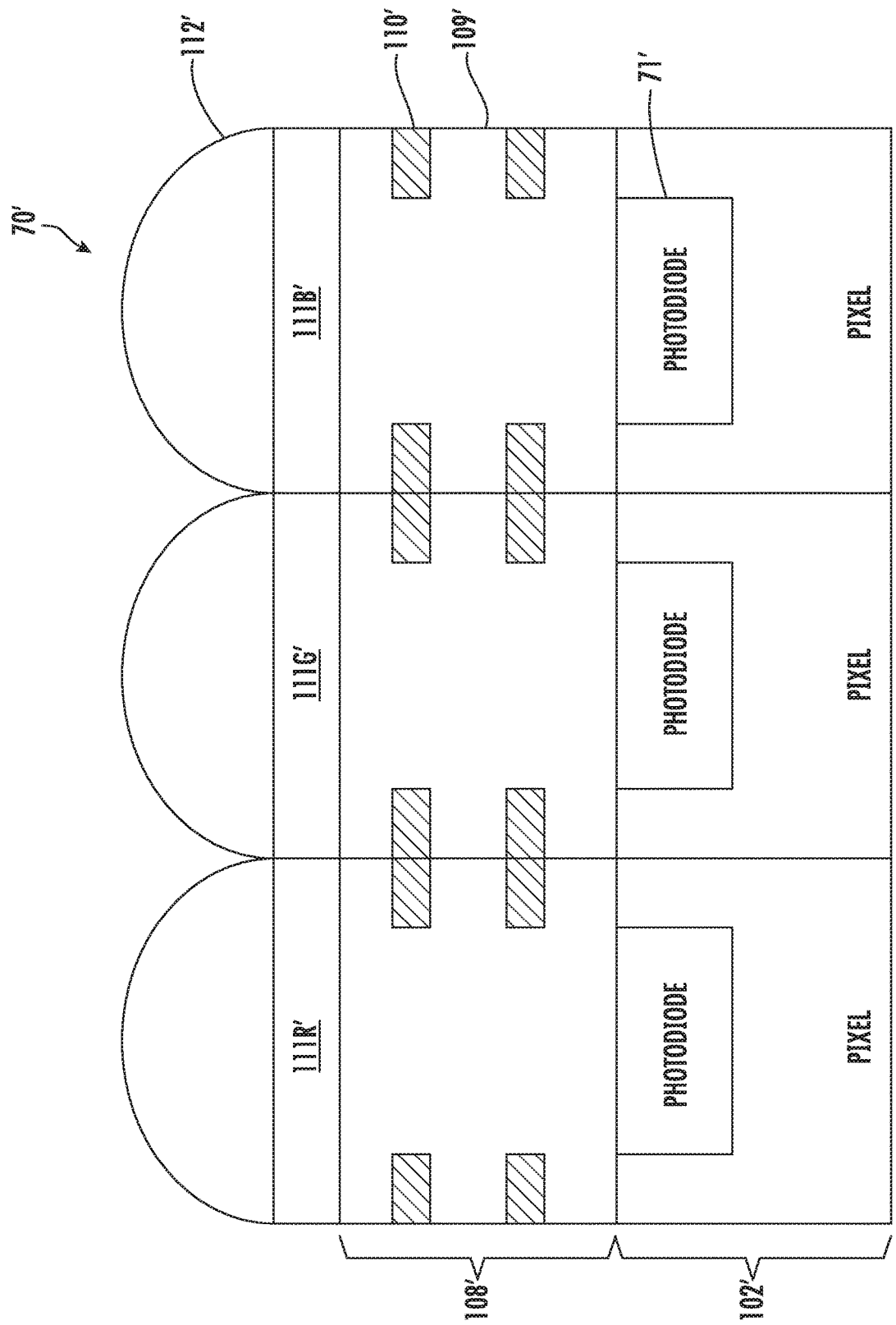

CMOS IMAGE SENSOR INCLUDING PIXELS WITH READ CIRCUITRY HAVING A SUPERLATTICE

TECHNICAL FIELD

The present disclosure generally relates to semiconductor devices and, more particularly, to CMOS image sensor devices and related methods.

BACKGROUND

Structures and techniques have been proposed to enhance the performance of semiconductor devices, such as by enhancing the mobility of the charge carriers. For example, U.S. Patent Application No. 2003/0057416 to Currie et al. discloses strained material layers of silicon, silicon-germanium, and relaxed silicon and also including impurity-free zones that would otherwise cause performance degradation. The resulting biaxial strain in the upper silicon layer alters the carrier mobilities enabling higher speed and/or lower power devices. Published U.S. Patent Application No. 2003/0034529 to Fitzgerald et al. discloses a CMOS inverter also based upon similar strained silicon technology.

U.S. Pat. No. 6,472,685 B2 to Takagi discloses a semiconductor device including a silicon and carbon layer sandwiched between silicon layers so that the conduction band and valence band of the second silicon layer receive a tensile strain. Electrons having a smaller effective mass, and which have been induced by an electric field applied to the gate electrode, are confined in the second silicon layer, thus, an n-channel MOSFET is asserted to have a higher mobility.

U.S. Pat. No. 4,937,204 to Ishibashi et al. discloses a superlattice in which a plurality of layers, less than eight monolayers, and containing a fractional or binary or a binary compound semiconductor layer, are alternately and epitaxially grown. The direction of main current flow is perpendicular to the layers of the superlattice.

U.S. Pat. No. 5,357,119 to Wang et al. discloses a Si—Ge short period superlattice with higher mobility achieved by reducing alloy scattering in the superlattice. Along these lines, U.S. Pat. No. 5,683,934 to Candelaria discloses an enhanced mobility MOSFET including a channel layer comprising an alloy of silicon and a second material substitutionally present in the silicon lattice at a percentage that places the channel layer under tensile stress.

U.S. Pat. No. 5,216,262 to Tsu discloses a quantum well structure comprising two barrier regions and a thin epitaxially grown semiconductor layer sandwiched between the barriers. Each barrier region consists of alternate layers of $SiO_2$/Si with a thickness generally in a range of two to six monolayers. A much thicker section of silicon is sandwiched between the barriers.

An article entitled "Phenomena in silicon nanostructure devices" also to Tsu and published online Sep. 6, 2000 by Applied Physics and Materials Science & Processing, pp. 391-402 discloses a semiconductor-atomic superlattice (SAS) of silicon and oxygen. The Si/O superlattice is disclosed as useful in a silicon quantum and light-emitting devices. In particular, a green electroluminescence diode structure was constructed and tested. Current flow in the diode structure is vertical, that is, perpendicular to the layers of the SAS. The disclosed SAS may include semiconductor layers separated by adsorbed species such as oxygen atoms, and CO molecules. The silicon growth beyond the adsorbed monolayer of oxygen is described as epitaxial with a fairly low defect density. One SAS structure included a 1.1 nm thick silicon portion that is about eight atomic layers of silicon, and another structure had twice this thickness of silicon. An article to Luo et al. entitled "Chemical Design of Direct-Gap Light-Emitting Silicon" published in Physical Review Letters, Vol. 89, No. 7 (Aug. 12, 2002) further discusses the light emitting SAS structures of Tsu.

Published International Application WO 02/103,767 A1 to Wang, Tsu and Lofgren, discloses a barrier building block of thin silicon and oxygen, carbon, nitrogen, phosphorous, antimony, arsenic or hydrogen to thereby reduce current flowing vertically through the lattice more than four orders of magnitude. The insulating layer/barrier layer allows for low defect epitaxial silicon to be deposited next to the insulating layer.

Published Great Britain Patent Application 2,347,520 to Mears et al. discloses that principles of Aperiodic Photonic Band-Gap (APBG) structures may be adapted for electronic bandgap engineering. In particular, the application discloses that material parameters, for example, the location of band minima, effective mass, etc., can be tailored to yield new aperiodic materials with desirable band-structure characteristics. Other parameters, such as electrical conductivity, thermal conductivity and dielectric permittivity or magnetic permeability are disclosed as also possible to be designed into the material.

Furthermore, U.S. Pat. No. 6,376,337 to Wang et al. discloses a method for producing an insulating or barrier layer for semiconductor devices which includes depositing a layer of silicon and at least one additional element on the silicon substrate whereby the deposited layer is substantially free of defects such that epitaxial silicon substantially free of defects can be deposited on the deposited layer. Alternatively, a monolayer of one or more elements, preferably comprising oxygen, is absorbed on a silicon substrate. A plurality of insulating layers sandwiched between epitaxial silicon forms a barrier composite.

Despite the existence of such approaches, further enhancements may be desirable for using advanced semiconductor materials and processing techniques to achieve improved performance in semiconductor devices, such as image sensors.

SUMMARY

A CMOS image sensor may include an active pixel sensor array including a plurality of pixels. Each pixel may include a photodiode and read circuitry coupled to the photodiode and including a plurality of transistors defining a 4T cell arrangement. At least one of the transistors may include a first semiconductor layer and a superlattice on the first semiconductor layer including a plurality of stacked groups of layers. Each group of layers may include a plurality of stacked base semiconductor monolayers defining a base semiconductor portion, and the superlattice may further include at least one non-semiconductor monolayer constrained within a crystal lattice of adjacent base semiconductor portions. The transistor(s) may also include a second semiconductor layer on the superlattice, spaced apart source and drain regions in the second semiconductor layer defining a channel therebetween, and a gate including a gate insulating layer on the second semiconductor layer and a gate electrode on the gate insulating layer.

By way of example, the at least one transistor may include one or more of a transfer gate transistor, a source-follower transistor, a reset transistor, and a selection transistor. Moreover, the transfer gate transistor may include a negative gate bias implant in the first semiconductor layer adjacent the drain region, for example. Furthermore, the active pixel sensor array may be a back side illumination (BSI) active pixel sensor array, or a front side illumination (FSI) active pixel sensor array. In addition, a respective color filter and microlens may overlie each of the pixels. In an example embodiment, the at least one non-semiconductor monolayer may comprise oxygen, and the semiconductor monolayers may comprise silicon.

BRIEF DESCRIPTION OF THE DRAWINGS

FIG. 11 is a schematic cross-sectional diagram of a front side illumination (FSI) image sensor array in which the pixel of FIG. 5 may be incorporated.

DETAILED DESCRIPTION

Figure 1:
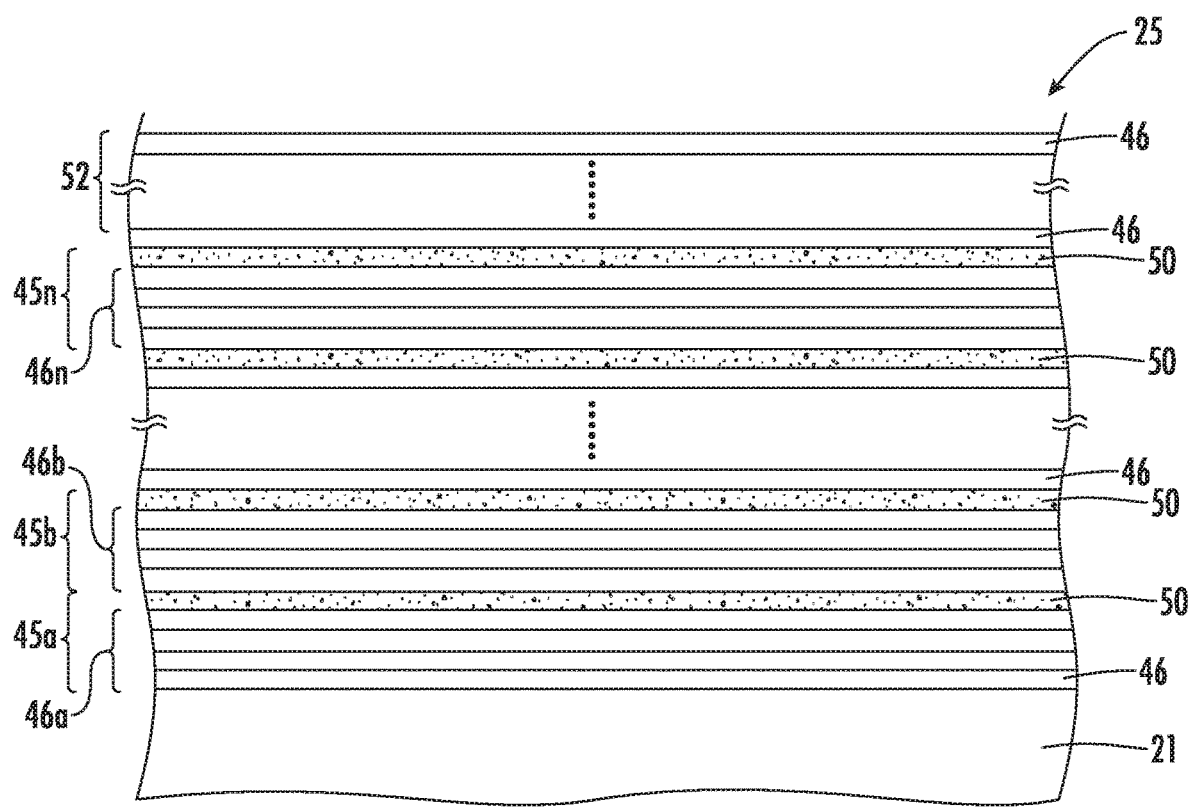
FIG. 1 is a greatly enlarged schematic cross-sectional view of a superlattice for use in a semiconductor device in accordance with an example embodiment.

Example embodiments will now be described more fully hereinafter with reference to the accompanying drawings, in which the example embodiments are shown. The embodiments may, however, be implemented in many different forms and should not be construed as limited to the specific examples set forth herein. Rather, these embodiments are provided so that this disclosure will be thorough and complete. Like numbers refer to like elements throughout, and prime notation is used to indicate similar elements in different embodiments.

Generally speaking, the present disclosure relates to using advanced semiconductor materials, such as the superlattice 25 described further below, to provide enhanced operating characteristics in optical devices, such as CMOS image sensors. The superlattice 25 is also referred to as an "MST" material herein. Applicant theorizes, without wishing to be bound thereto, that certain superlattices as described herein reduce the effective mass of charge carriers and that this thereby leads to higher charge carrier mobility. Effective mass is described with various definitions in the literature. As a measure of the improvement in effective mass Applicant's use a "conductivity reciprocal effective mass tensor", $M_e^{-1}$ and $M_h^{-1}$ for electrons and holes respectively, defined as:

$$M_{e,ij}^{-1}(E_F, T) = \frac{\sum_{E>E_F} \int_{B.Z.} (\nabla_k E(k,n))_i (\nabla_k E(k,n))_j \frac{\partial f(E(k,n), E_F, T)}{\partial E} d^3k}{\sum_{E>E_F} \int_{B.Z.} f(E(k,n), E_F, T) d^3k}$$

$$M_{h,ij}^{-1}(E_F, T) = \\ -\frac{\sum_{E<E_F} \int_{B.Z.} (\nabla_k E(k,n))_i (\nabla_k E(k,n))_j \frac{\partial f(E(k,n), E_F, T)}{\partial E} d^3k}{\sum_{E<E_F} \int_{B.Z.} (1 - f(E(k,n), E_F, T)) d^3k}$$

for electrons and:
for holes, where f is the Fermi-Dirac distribution, $E_F$ is the Fermi energy, T is the temperature, E(k,n) is the energy of an electron in the state corresponding to wave vector k and the $n^{th}$ energy band, the indices i and j refer to Cartesian coordinates x, y and z, the integrals are taken over the Brillouin zone (B.Z.), and the summations are taken over bands with energies above and below the Fermi energy for electrons and holes respectively.

Applicant's definition of the conductivity reciprocal effective mass tensor is such that a tensorial component of the conductivity of the material is greater for greater values of the corresponding component of the conductivity reciprocal effective mass tensor. Again Applicant theorizes without wishing to be bound thereto that the superlattices described herein set the values of the conductivity reciprocal effective mass tensor so as to enhance the conductive properties of the material, such as typically for a preferred direction of charge carrier transport. The inverse of the appropriate tensor element is referred to as the conductivity effective mass. In other words, to characterize semiconductor material structures, the conductivity effective mass for electrons/holes as described above and calculated in the direction of intended carrier transport is used to distinguish improved materials.

Applicant has identified improved materials or structures for use in semiconductor devices. More specifically, Applicant has identified materials or structures having energy band structures for which the appropriate conductivity effective masses for electrons and/or holes are substantially less than the corresponding values for silicon. In addition to the enhanced mobility characteristics of these structures, they may also be formed or used in such a manner that they provide piezoelectric, pyroelectric, and/or ferroelectric properties that are advantageous for use in a variety of different types of devices, as will be discussed further below.

Figure 2:
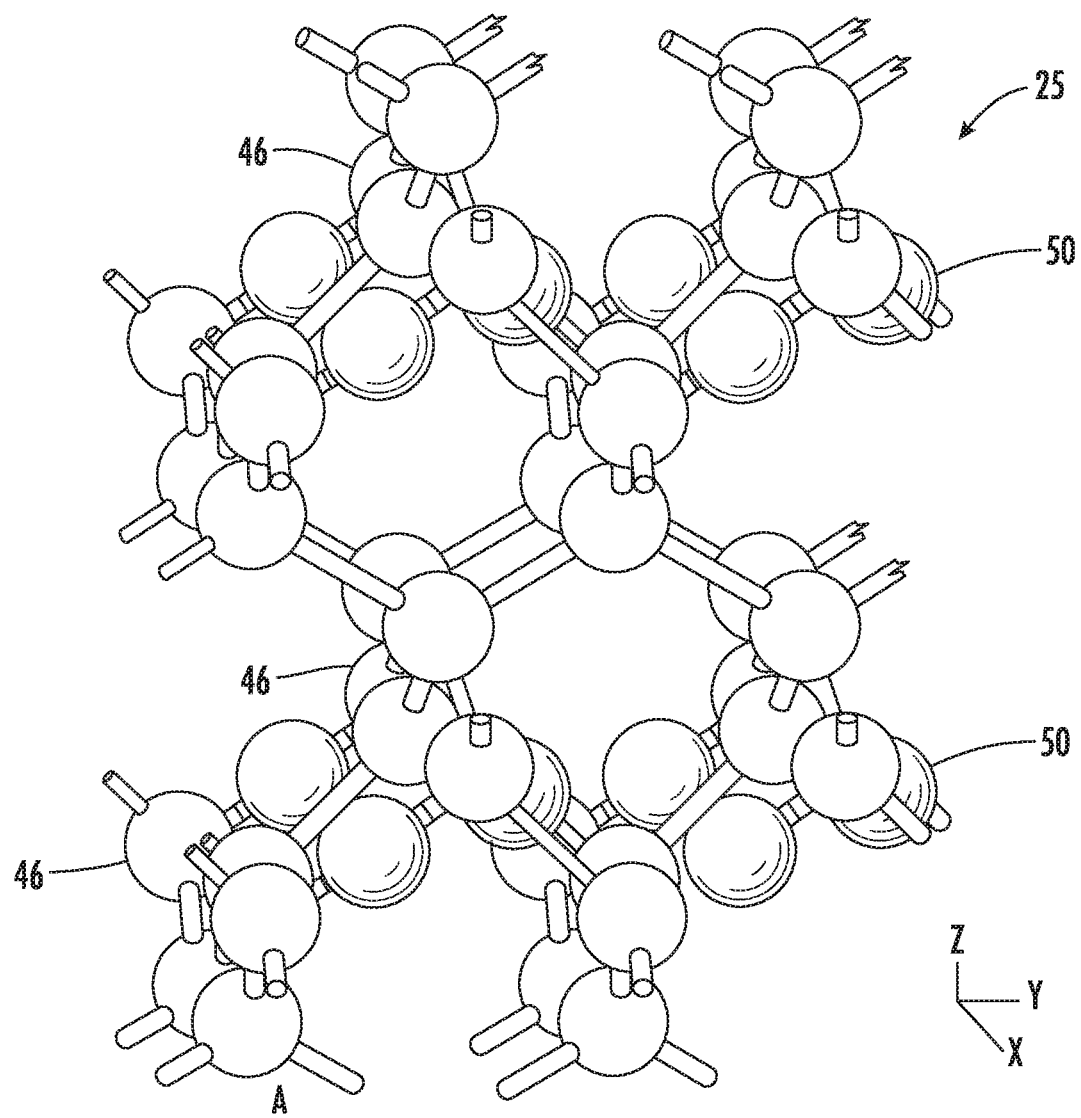
FIG. 2 is a perspective schematic atomic diagram of a portion of the superlattice shown in FIG. 1.

Referring now to FIGS. 1 and 2, the materials or structures are in the form of a superlattice 25 whose structure is controlled at the atomic or molecular level and may be formed using known techniques of atomic or molecular layer deposition. The superlattice 25 includes a plurality of layer groups 45a-45n arranged in stacked relation, as perhaps best understood with specific reference to the schematic cross-sectional view of FIG. 1.

Each group of layers 45a-45n of the superlattice 25 illustratively includes a plurality of stacked base semiconductor monolayers 46 defining a respective base semiconductor portion 46a-46n and an energy band-modifying layer 50 thereon. The energy band-modifying layers 50 are indicated by stippling in FIG. 1 for clarity of illustration.

The energy band-modifying layer 50 illustratively includes one non-semiconductor monolayer constrained within a crystal lattice of adjacent base semiconductor portions. By "constrained within a crystal lattice of adjacent base semiconductor portions" it is meant that at least some semiconductor atoms from opposing base semiconductor portions 46a-46n are chemically bound together through the non-semiconductor monolayer 50 therebetween, as seen in FIG. 2. Generally speaking, this configuration is made possible by controlling the amount of non-semiconductor material that is deposited on semiconductor portions 46a-46n through atomic layer deposition techniques so that not all (i.e., less than full or 100% coverage) of the available semiconductor bonding sites are populated with bonds to non-semiconductor atoms, as will be discussed further below. Thus, as further monolayers 46 of semiconductor material are deposited on or over a non-semiconductor monolayer 50, the newly deposited semiconductor atoms will populate the remaining vacant bonding sites of the semiconductor atoms below the non-semiconductor monolayer.

In other embodiments, more than one such non-semiconductor monolayer may be possible. It should be noted that reference herein to a non-semiconductor or semiconductor monolayer means that the material used for the monolayer would be a non-semiconductor or semiconductor if formed in bulk. That is, a single monolayer of a material, such as silicon, may not necessarily exhibit the same properties that it would if formed in bulk or in a relatively thick layer, as will be appreciated by those skilled in the art.

Applicant theorizes without wishing to be bound thereto that energy band-modifying layers 50 and adjacent base semiconductor portions 46a-46n cause the superlattice 25 to have a lower appropriate conductivity effective mass for the charge carriers in the parallel layer direction than would otherwise be present. Considered another way, this parallel direction is orthogonal to the stacking direction. The band modifying layers 50 may also cause the superlattice 25 to have a common energy band structure, while also advantageously functioning as an insulator between layers or regions vertically above and below the superlattice.

Moreover, this superlattice structure may also advantageously act as a barrier to dopant and/or material diffusion between layers vertically above and below the superlattice 25. These properties may thus advantageously allow the superlattice 25 to provide an interface for high-K dielectrics which not only reduces diffusion of the high-K material into the channel region, but which may also advantageously reduce unwanted scattering effects and improve device mobility, as will be appreciated by those skilled in the art.

It is also theorized that semiconductor devices including the superlattice 25 may enjoy a higher charge carrier mobility based upon the lower conductivity effective mass than would otherwise be present. In some embodiments, and as a result of the band engineering achieved by the present invention, the superlattice 25 may further have a substantially direct energy bandgap that may be particularly advantageous for opto-electronic devices, for example.

The superlattice 25 also illustratively includes a cap layer 52 on an upper layer group 45n. The cap layer 52 may comprise a plurality of base semiconductor monolayers 46. The cap layer 52 may have between 2 to 100 monolayers of the base semiconductor, and, more preferably between 10 to 50 monolayers.

Each base semiconductor portion 46a-46n may comprise a base semiconductor selected from the group consisting of Group IV semiconductors, Group III-V semiconductors, and Group II-VI semiconductors. Of course, the term Group IV semiconductors also includes Group IV-IV semiconductors, as will be appreciated by those skilled in the art. More particularly, the base semiconductor may comprise at least one of silicon and germanium, for example.

Each energy band-modifying layer 50 may comprise a non-semiconductor selected from the group consisting of oxygen, nitrogen, fluorine, carbon and carbon-oxygen, for example. The non-semiconductor is also desirably thermally stable through deposition of a next layer to thereby facilitate manufacturing. In other embodiments, the non-semiconductor may be another inorganic or organic element or compound that is compatible with the given semiconductor processing as will be appreciated by those skilled in the art. More particularly, the base semiconductor may comprise at least one of silicon and germanium, for example It should be noted that the term monolayer is meant to include a single atomic layer and also a single molecular layer. It is also noted that the energy band-modifying layer 50 provided by a single monolayer is also meant to include a monolayer wherein not all of the possible sites are occupied (i.e., there is less than full or 100% coverage). For example, with particular reference to the atomic diagram of FIG. 2, a 4/1 repeating structure is illustrated for silicon as the base semiconductor material, and oxygen as the energy band-modifying material. Only half of the possible sites for oxygen are occupied in the illustrated example.

In other embodiments and/or with different materials this one-half occupation would not necessarily be the case as will be appreciated by those skilled in the art. Indeed it can be seen even in this schematic diagram, that individual atoms of oxygen in a given monolayer are not precisely aligned along a flat plane as will also be appreciated by those of skill in the art of atomic deposition. By way of example, a preferred occupation range is from about one-eighth to one-half of the possible oxygen sites being full, although other numbers may be used in certain embodiments.

Silicon and oxygen are currently widely used in conventional semiconductor processing, and, hence, manufacturers will be readily able to use these materials as described herein. Atomic or monolayer deposition is also now widely used. Accordingly, semiconductor devices incorporating the superlattice 25 in accordance with the invention may be readily adopted and implemented, as will be appreciated by those skilled in the art.

It is theorized without Applicant wishing to be bound thereto that for a superlattice, such as the Si/O superlattice, for example, that the number of silicon monolayers should desirably be seven or less so that the energy band of the superlattice is common or relatively uniform throughout to achieve the desired advantages. The 4/1 repeating structure shown in FIGS. 1 and 2, for Si/O has been modeled to indicate an enhanced mobility for electrons and holes in the X direction. For example, the calculated conductivity effective mass for electrons (isotropic for bulk silicon) is 0.26 and for the 4/1 SiO superlattice in the X direction it is 0.12 resulting in a ratio of 0.46. Similarly, the calculation for holes yields values of 0.36 for bulk silicon and 0.16 for the 4/1 Si/O superlattice resulting in a ratio of 0.44.

While such a directionally preferential feature may be desired in certain semiconductor devices, other devices may benefit from a more uniform increase in mobility in any direction parallel to the groups of layers. It may also be beneficial to have an increased mobility for both electrons and holes, or just one of these types of charge carriers as will be appreciated by those skilled in the art.

The lower conductivity effective mass for the 4/1 Si/O embodiment of the superlattice 25 may be less than two-thirds the conductivity effective mass than would otherwise occur, and this applies for both electrons and holes. Of course, the superlattice 25 may further comprise at least one type of conductivity dopant therein, as will also be appreciated by those skilled in the art.

Figure 3:
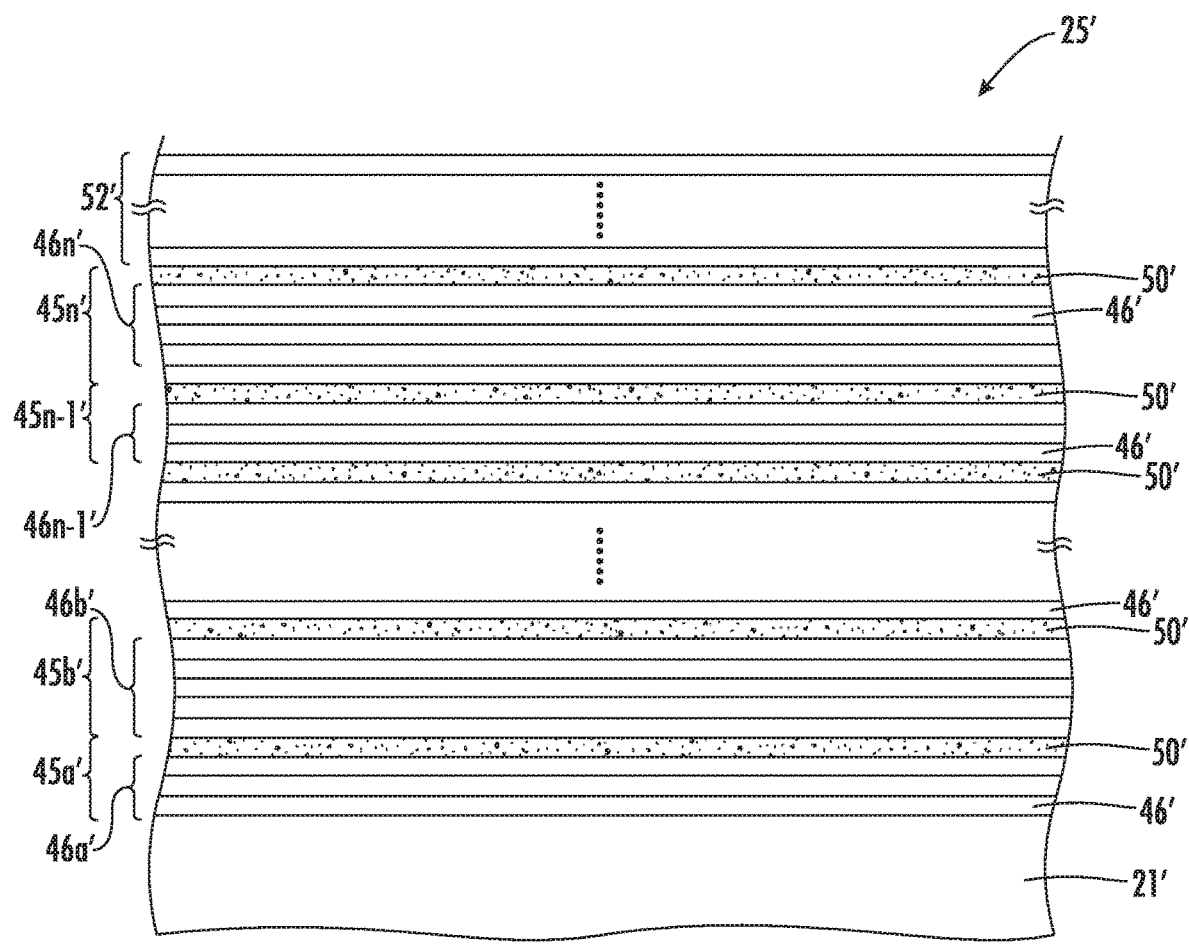
FIG. 3 is a greatly enlarged schematic cross-sectional view of another embodiment of a superlattice in accordance with an example embodiment.

Indeed, referring now additionally to FIG. 3, another embodiment of a superlattice 25' in accordance with the invention having different properties is now described. In this embodiment, a repeating pattern of 3/1/5/1 is illustrated. More particularly, the lowest base semiconductor portion 46a' has three monolayers, and the second lowest base semiconductor portion 46b' has five monolayers. This pattern repeats throughout the superlattice 25'. The energy band-modifying layers 50' may each include a single monolayer. For such a superlattice 25' including Si/O, the enhancement of charge carrier mobility is independent of orientation in the plane of the layers. Those other elements of FIG. 3 not specifically mentioned are similar to those discussed above with reference to FIG. 1 and need no further discussion herein.

In some device embodiments, all of the base semiconductor portions of a superlattice may be a same number of monolayers thick. In other embodiments, at least some of the base semiconductor portions may be a different number of monolayers thick. In still other embodiments, all of the base semiconductor portions may be a different number of monolayers thick.

Figure 4A:
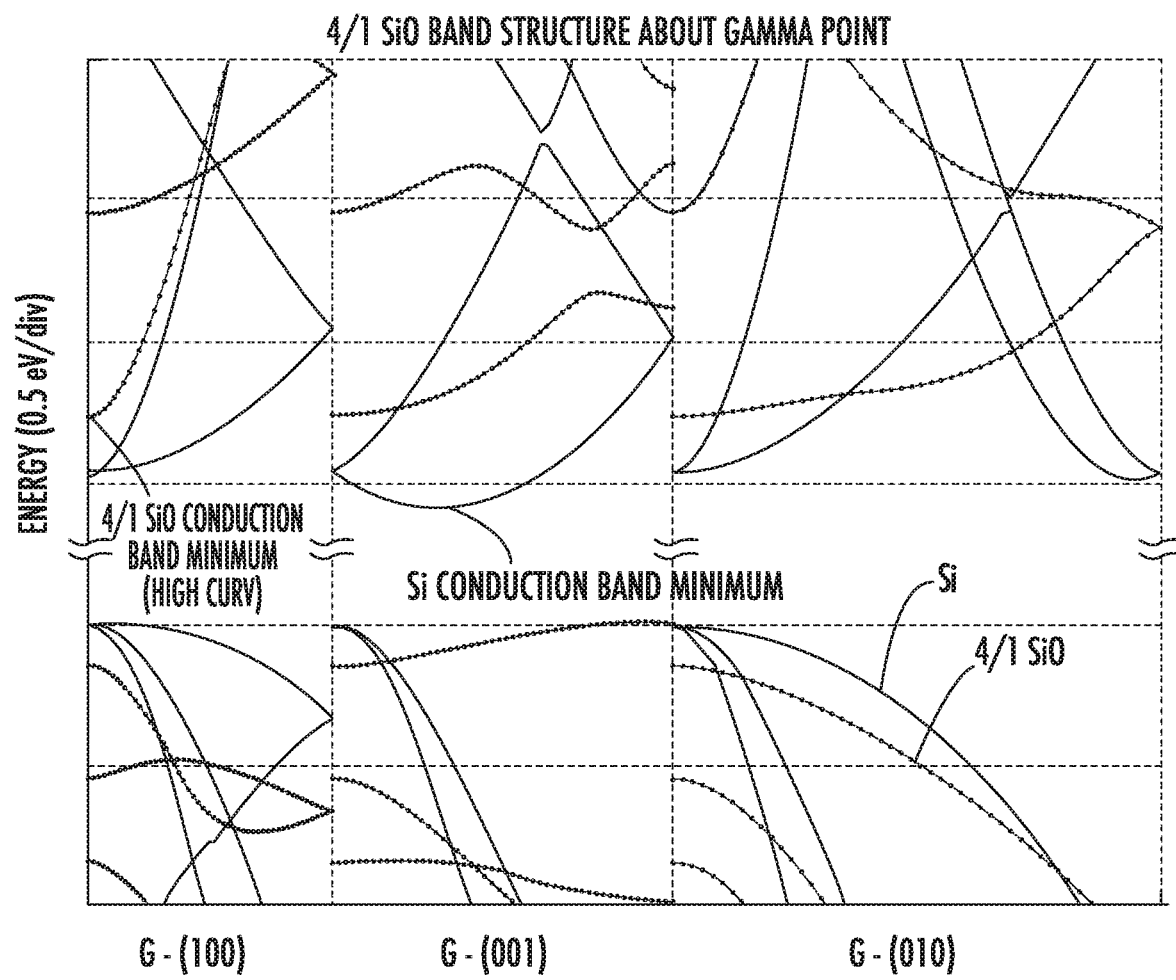
FIG. 4A is a graph of the calculated band structure from the gamma point (G) for both bulk silicon as in the prior art, and for the 4/1 Si/O superlattice as shown in FIGS. 1-2.
Figure 4B:
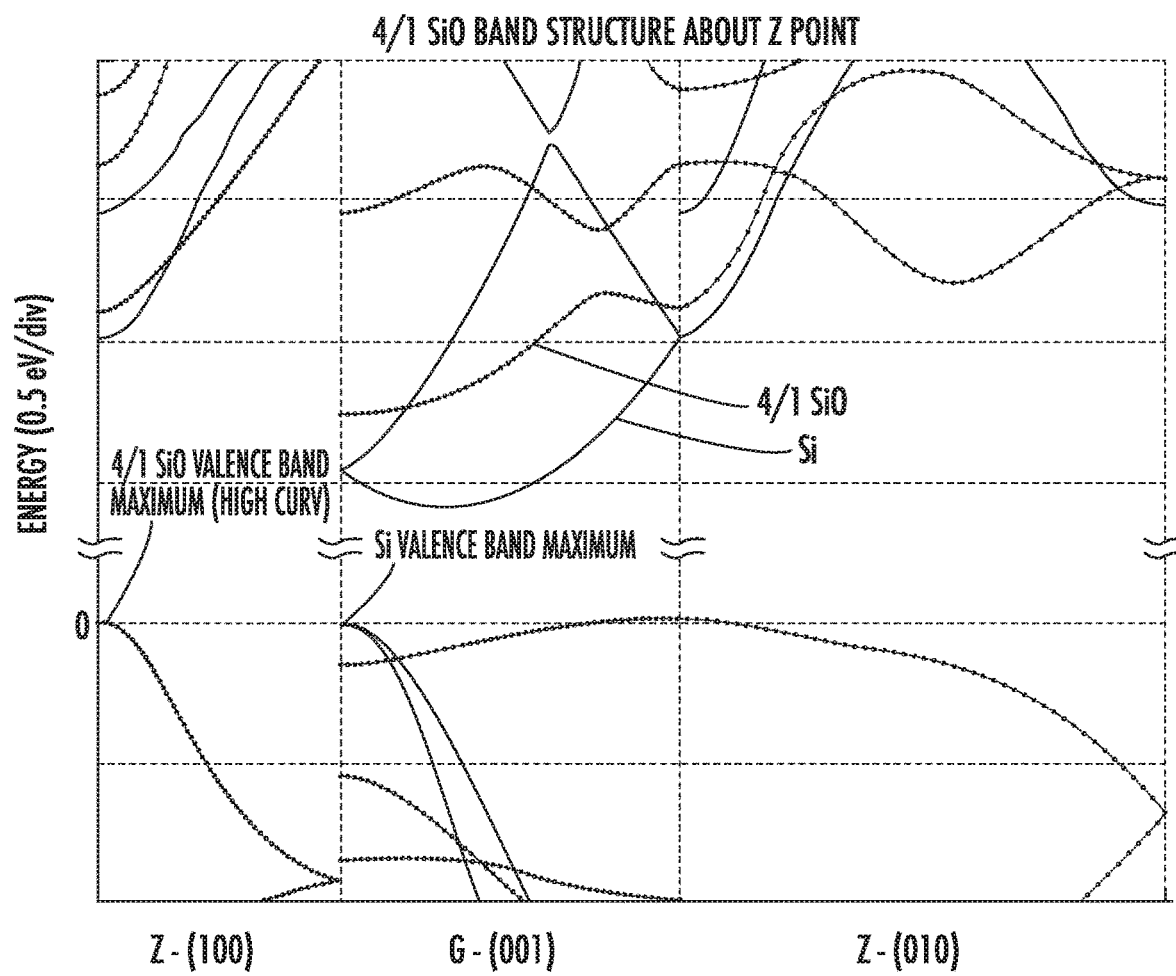
FIG. 4B is a graph of the calculated band structure from the Z point for both bulk silicon as in the prior art, and for the 4/1 Si/O superlattice as shown in FIGS. 1-2.
Figure 4C:
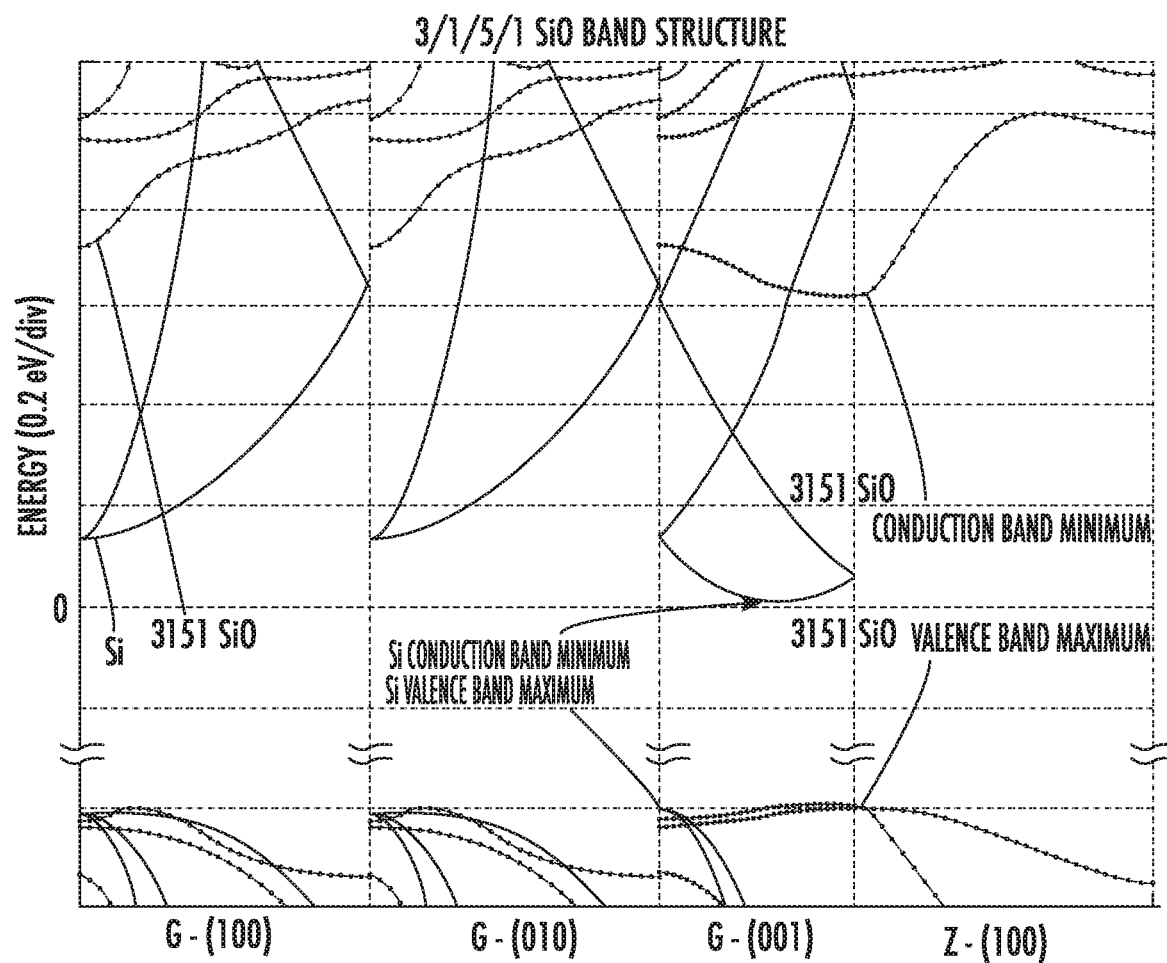
FIG. 4C is a graph of the calculated band structure from both the gamma and Z points for both bulk silicon as in the prior art, and for the 5/1/3/1 Si/O superlattice as shown in FIG. 3.

In FIGS. 4A-4C, band structures calculated using Density Functional Theory (DFT) are presented. It is well known in the art that DFT underestimates the absolute value of the bandgap. Hence all bands above the gap may be shifted by an appropriate "scissors correction." However the shape of the band is known to be much more reliable. The vertical energy axes should be interpreted in this light.

FIG. 4A shows the calculated band structure from the gamma point (G) for both bulk silicon (represented by continuous lines) and for the 4/1 Si/O superlattice 25 shown in FIG. 1 (represented by dotted lines). The directions refer to the unit cell of the 4/1 Si/O structure and not to the conventional unit cell of Si, although the (001) direction in the figure does correspond to the (001) direction of the conventional unit cell of Si, and, hence, shows the expected location of the Si conduction band minimum. The (100) and (010) directions in the figure correspond to the (110) and (−110) directions of the conventional Si unit cell. Those skilled in the art will appreciate that the bands of Si on the figure are folded to represent them on the appropriate reciprocal lattice directions for the 4/1 Si/O structure.

It can be seen that the conduction band minimum for the 4/1 Si/O structure is located at the gamma point in contrast to bulk silicon (Si), whereas the valence band minimum occurs at the edge of the Brillouin zone in the (001) direction which we refer to as the Z point. One may also note the greater curvature of the conduction band minimum for the 4/1 Si/O structure compared to the curvature of the conduction band minimum for Si owing to the band splitting due to the perturbation introduced by the additional oxygen layer.

FIG. 4B shows the calculated band structure from the Z point for both bulk silicon (continuous lines) and for the 4/1 Si/O superlattice 25 (dotted lines). This figure illustrates the enhanced curvature of the valence band in the (100) direction.

FIG. 4C shows the calculated band structure from both the gamma and Z point for both bulk silicon (continuous lines) and for the 5/1/3/1 Si/O structure of the superlattice 25' of FIG. 3 (dotted lines). Due to the symmetry of the 5/1/3/1 Si/O structure, the calculated band structures in the (100) and (010) directions are equivalent. Thus the conductivity effective mass and mobility are expected to be isotropic in the plane parallel to the layers, i.e. perpendicular to the (001) stacking direction. Note that in the 5/1/3/1 Si/O example the conduction band minimum and the valence band maximum are both at or close to the Z point.

Although increased curvature is an indication of reduced effective mass, the appropriate comparison and discrimination may be made via the conductivity reciprocal effective mass tensor calculation. This leads Applicant to further theorize that the 5/1/3/1 superlattice 25' should be substantially direct bandgap. As will be understood by those skilled in the art, the appropriate matrix element for optical transition is another indicator of the distinction between direct and indirect bandgap behavior.

Figure 5:
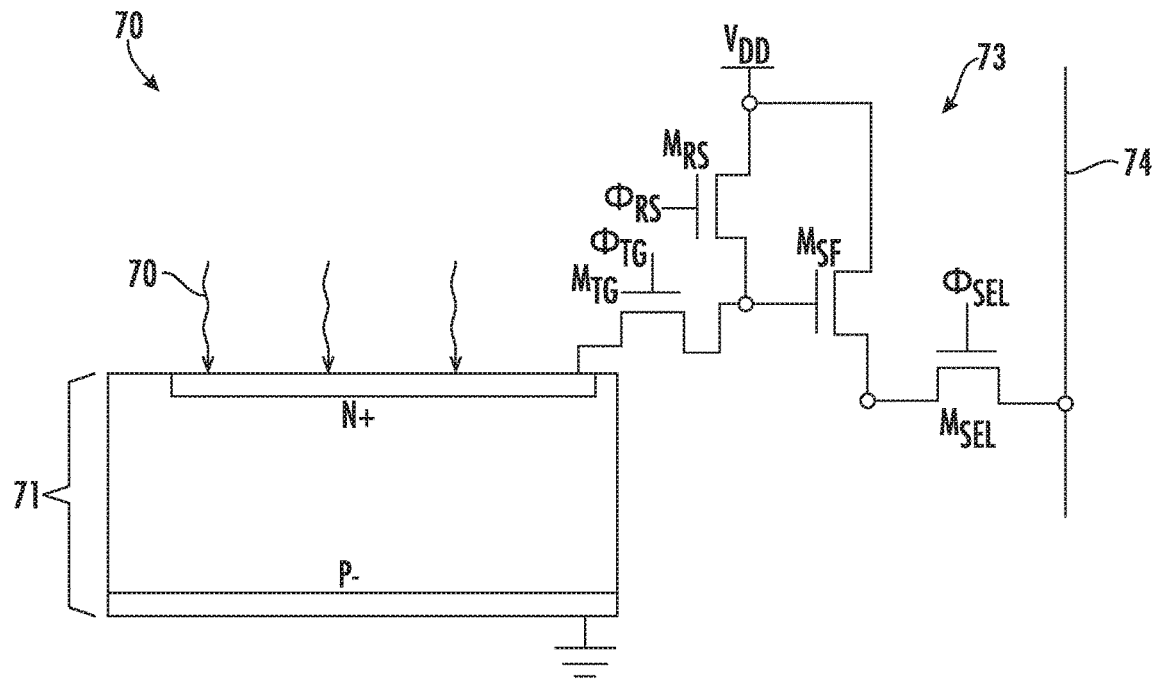
FIG. 5 is a schematic block diagram of a CMOS image sensor pixel including read circuitry with a superlattice in accordance with an example embodiment.

Turning now to FIG. 5, the above-described superlattice structures may advantageously be used in the read circuitry gates of a CMOS image sensor (CIS) active pixel array to advantageously provide enhanced negative bias operation, reduced shot noise, and/or reduced fixed pattern noise (FPN) in certain embodiments. An example pixel 70 is first described, and example pixel sensor array configurations in which the pixel may be used are described further below.

In particular, the pixel 70 illustratively includes a photodiode 71 defining an N+ to P− sub junction, which upon being illuminated by light 72 provides an output by way of read circuitry 73. In the illustrated example, a 4T pixel configuration is shown in which the read circuitry 73 includes a transfer gate transistor $M_{TG}$, a source-follower transistor $M_{SF}$, a reset transistor $M_{RS}$, and a selection transistor $MS_{EL}$. More particularly, the transfer gate transistor $M_{TG}$ illustratively includes a first conduction terminal coupled to the photodiode 71 and a second conduction terminal, and a control terminal receiving a signal $\phi_{TG}$. The reset transistor $M_{RS}$ illustratively includes a first conduction terminal coupled to the second conduction terminal of the transistor $M_{TG}$, a second conduction terminal coupled to a voltage $V_{DD}$, and a control terminal coupled to a signal $\phi_{RS}$. The source-follower transistor $M_{SF}$ illustratively includes a first conduction terminal coupled to the voltage $V_{DD}$, a second conduction terminal, and a control terminal coupled to the second conduction terminal of the transistor $M_{TG}$. Additionally, the selection transistor $M_{SEL}$ illustratively includes a first conduction terminal coupled to the second conduction terminal of the source-follower transistor $M_{SF}$, a second conduction terminal coupled to a column output line 74, and a control terminal coupled to a signal $\phi_{SEL}$.

Figure 6:
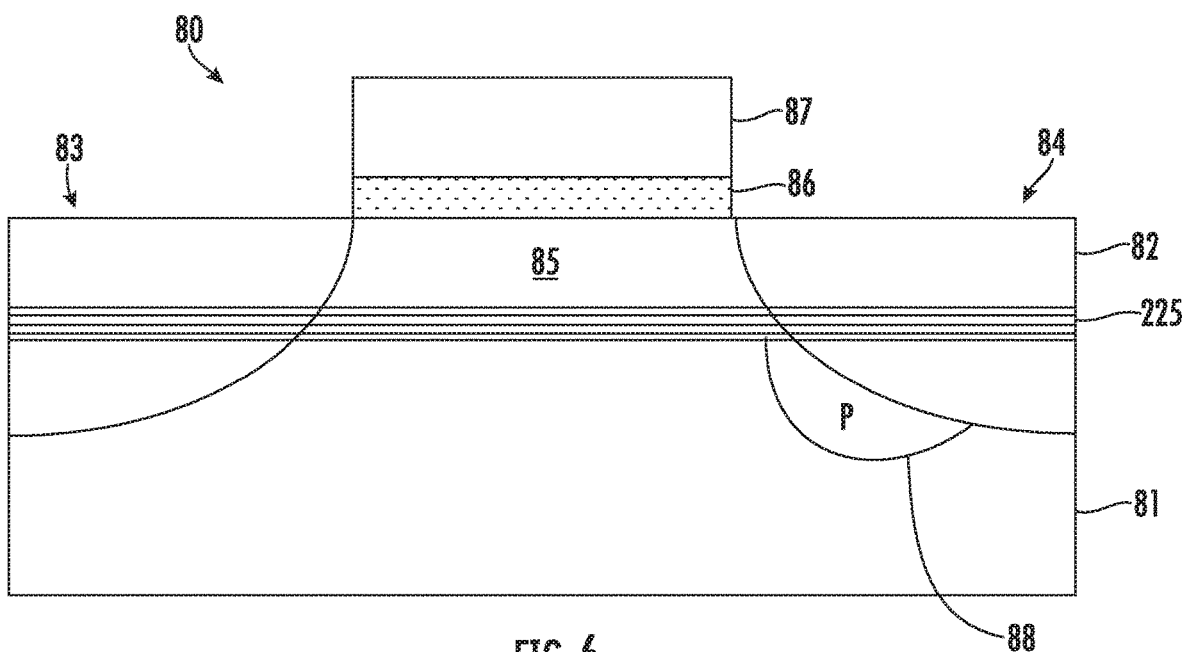
FIG. 6 is a schematic cross-sectional diagram of an example implementation of the transfer gate transistor of the pixel of FIG. 5 including a superlattice.

Turning to FIG. 6, an example transistor 80 which may be used for the transfer gate transistor $M_{TG}$ is now described. By way of background, negative gate bias on the transfer gate transistor of CMOS image sensors has been widely used to reduce Shockley-Read-Hall dark current generated at the Si—SiO$_2$ gate interface, and increase full-well capacity. However, lowering of the negative gate bias beyond a certain value may again increase dark current due to gate-induced drain leakage (GIDL) and trap assisted tunneling (TAT) mechanisms.

The transistor 80 illustratively includes a first semiconductor layer 81 (e.g., Si) and a superlattice 225 on the first semiconductor layer. The transistor 80 further illustratively includes a second semiconductor layer 82 (e.g., Si) on the superlattice 225, spaced apart source and drain regions 83, 84 in the second semiconductor layer defining a channel 85 therebetween, and a gate over the channel including a gate insulating layer 86 (e.g., $SiO_2$) on the second semiconductor layer and a gate electrode 87 on the gate insulating layer. The superlattice 225 may either be deposited as a blanket layer across the first semiconductor layer 81, or selectively formed in the desired locations on the first semiconductor layer in different embodiments.

In the illustrated example, a P-type implant (e.g., Boron) may be provided in the first semiconductor layer 81 adjacent the drain region 84 to advantageously provide a desired negative gate bias. Yet, because the transistor 80 advantageously includes the superlattice 225, which is spaced apart from the interface of the gate insulator layer 86 and the second semiconductor layer 85, diffusion of the P-type dopant 88 near the drain 84 may advantageously be blocked as a result of the above-described dopant blocking properties of the superlattice material. By way of example, a thickness of the second semiconductor layer 82 may be set so that the dopant 88 is located above 5-20 nm away from the $SiO_2$/Si interface between the layers 82 and 86. As a result, reduced surface doping may be used to provide for a reduction of leakage associated with GIDL and TAT mechanisms, and therefore allow for the desired increased negative bias operation.

Figure 7:
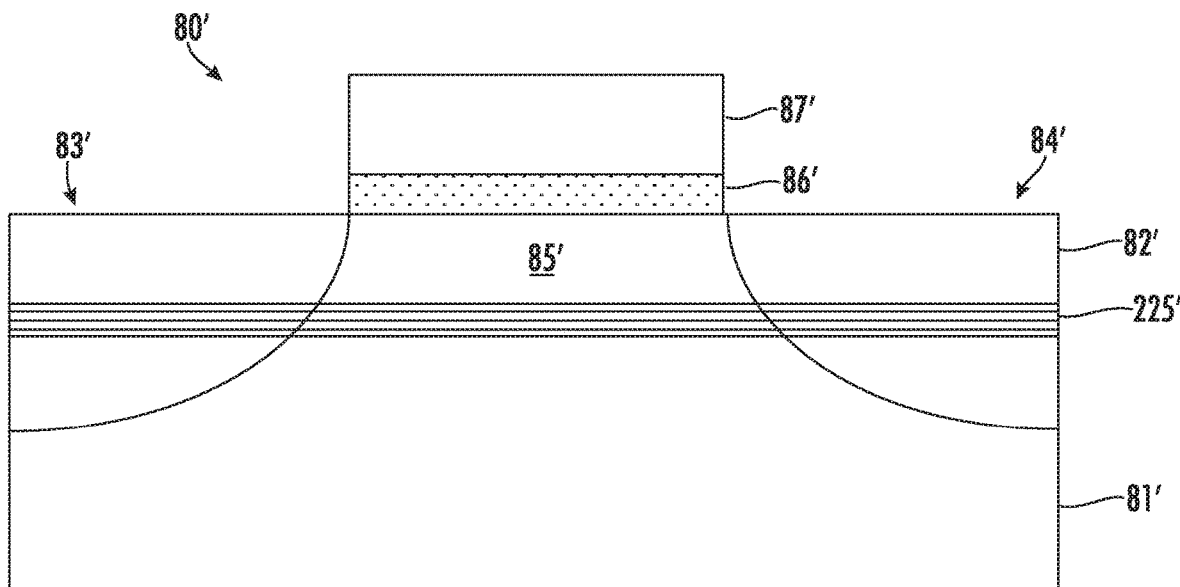
FIG. 7 is a schematic cross-sectional diagram of an example implementation of a transistor including a superlattice which may be used for the source follower, reset, and/or selection gates of the pixel of FIG. 5.
Figure 8:
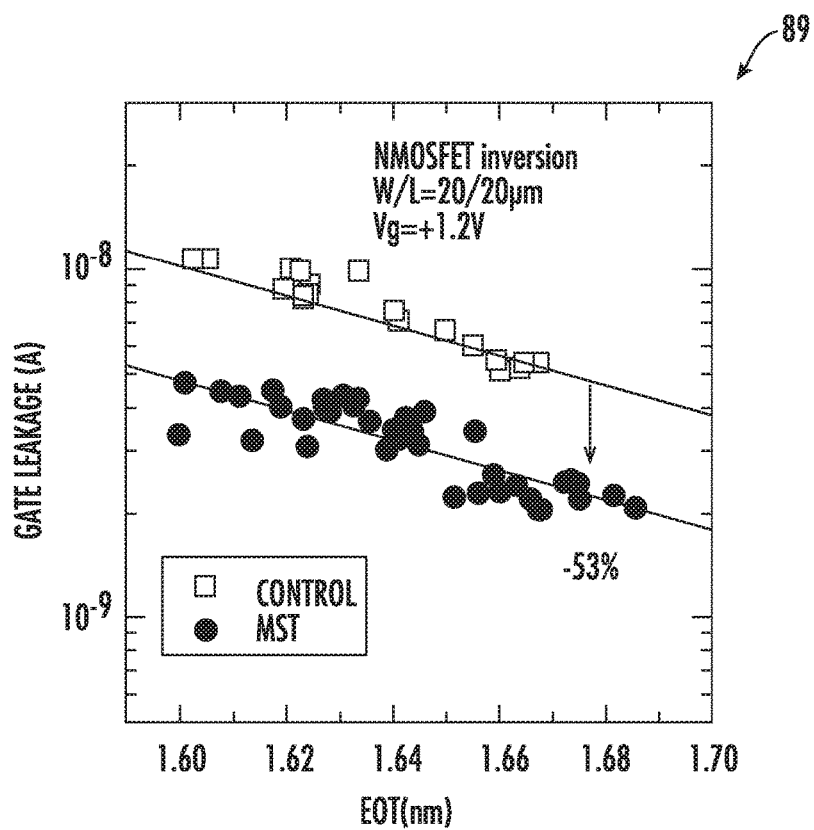
FIG. 8 is a graph of gate leakage vs. equivalent oxide thickness (EOT) for the transistor of FIG. 7 in a source-follower implementation.
Figure 9:
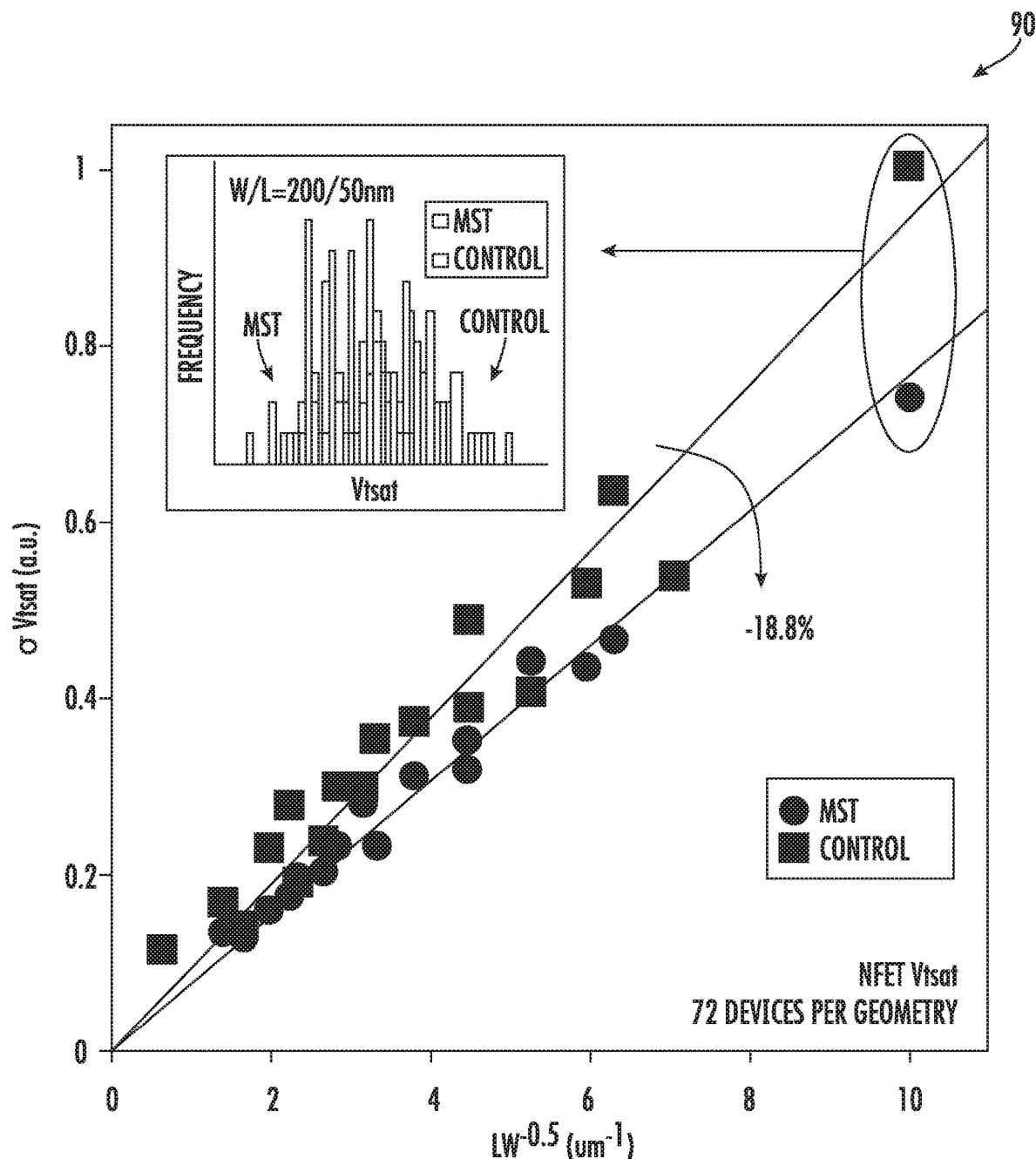
FIG. 9 is a graph of standard deviation of saturation Vt of 72 devices vs. $LW^{-0.5}$ for the transistor of FIG. 7 in a source-follower implementation.

Turning now to FIGS. 7-9, another example transistor 80' which may be used for one or more of the source-follower transistor $M_{SF}$, reset transistor $M_{RS}$, and selection transistor $M_{SEL}$ is now described. Here again, the transistor 80' illustratively includes a first semiconductor layer 81' and a superlattice 225' on the first semiconductor layer. The transistor 80' further illustratively includes a second semiconductor layer 82' on the superlattice 225', spaced apart source and drain regions 83', 84' doped in the second semiconductor layer defining a channel 85' therebetween, and a gate over the channel and including a gate insulating layer 86' on the second semiconductor layer and a gate electrode 87' on the gate insulating layer.

Generally speaking, for typical source-follower transistors, gate leakage current has increased by several orders of magnitude as CMOS technologies have downsized from 180 nm to 65 nm and beyond. The shot noise caused by this gate leakage current of the source-follower transistor has also increased significantly as a result in typical CMOS image sensors. In particular, for technology under 90 nm, shot noise caused by the gate leakage of the thin oxide source follower transistor may become such a severe problem as to dominate the total noise. As a result, some configurations utilize a relatively thick gate oxide in source-follower FETs.

In stark contrast, inclusion of the superlattice 225' may advantageously help reduce gate leakage current by more than half (approximately 53%), and thus allow for the use of a thinner gate oxide for source-follower implementations, as seen in the graph 89 of FIG. 8. More particularly, the graph 89 shows the results of simulated gate leakage vs. equivalent oxide thickness (EOT) for the transistor 80' with the MST superlattice layer 225' (circular data points), and for a similar configuration without the MST superlattice layer (square data points).

Another operational issue with respect to the source-follower and reset transistors of a conventional CMOS image sensor arrangement is fixed pattern noise (FPN) due to Vt and gain variation. Use of the superlattice 225' in the transistor 80' may advantageously reduce variability, as the MST superlattice material provides for the creation of super steep retrograde (SSR) doping profiles as a result of its inherent dopant diffusion blocking effect. Further details regarding the use of the MST material to provide desired SSR profiles are provided in U.S. Pat. Pub. Nos. 2016/0336406 and 2016/0336407 to Mears et al., which are also assigned to the present Applicant and are hereby incorporated herein in their entireties by reference.

By way of example, simulations of the transistor 80' and a control transistor (without an MST superlattice layer) were performed, and the results are provided in the graph 90 (FIG. 9) standard deviation of saturation Vt of 72 devices vs. $LW^{-0.5}$. Here again the square data points correspond to the control transistor, and the circular data points correspond to the transistor 80'. The graph 90 shows that the transistor 80' has 18.8% less Vt variability at the same device geometry as compared to the control transistor.

In accordance with another advantageous configuration, all of the transistors $M_{TG}$, $M_{SF}$, $M_{RS}$, and $M_{SEL}$ may advantageously include an MST superlattice layer as described above. In this regard, for increasing CIS performance, it is generally desirable that the area occupied by photodiodes is as large as possible. Use of the above-described transistor 80, 80' configurations allows for an increase in the area of the photodiodes, as use of the MST superlattice may advantageously increase transistor drive currents per unit area. This, in turn, allows for a reduction in the size of the 4T transistors. Thus, with the same die area, more area may be used for photodiodes, leading to an improvement of total performance of the CIS device. Due to the aforementioned Vt variability reduction effect, transistor 80 allows up to 34% area reduction of $M_{SF}$ and $M_{RS}$ transistors.

Figure 10:
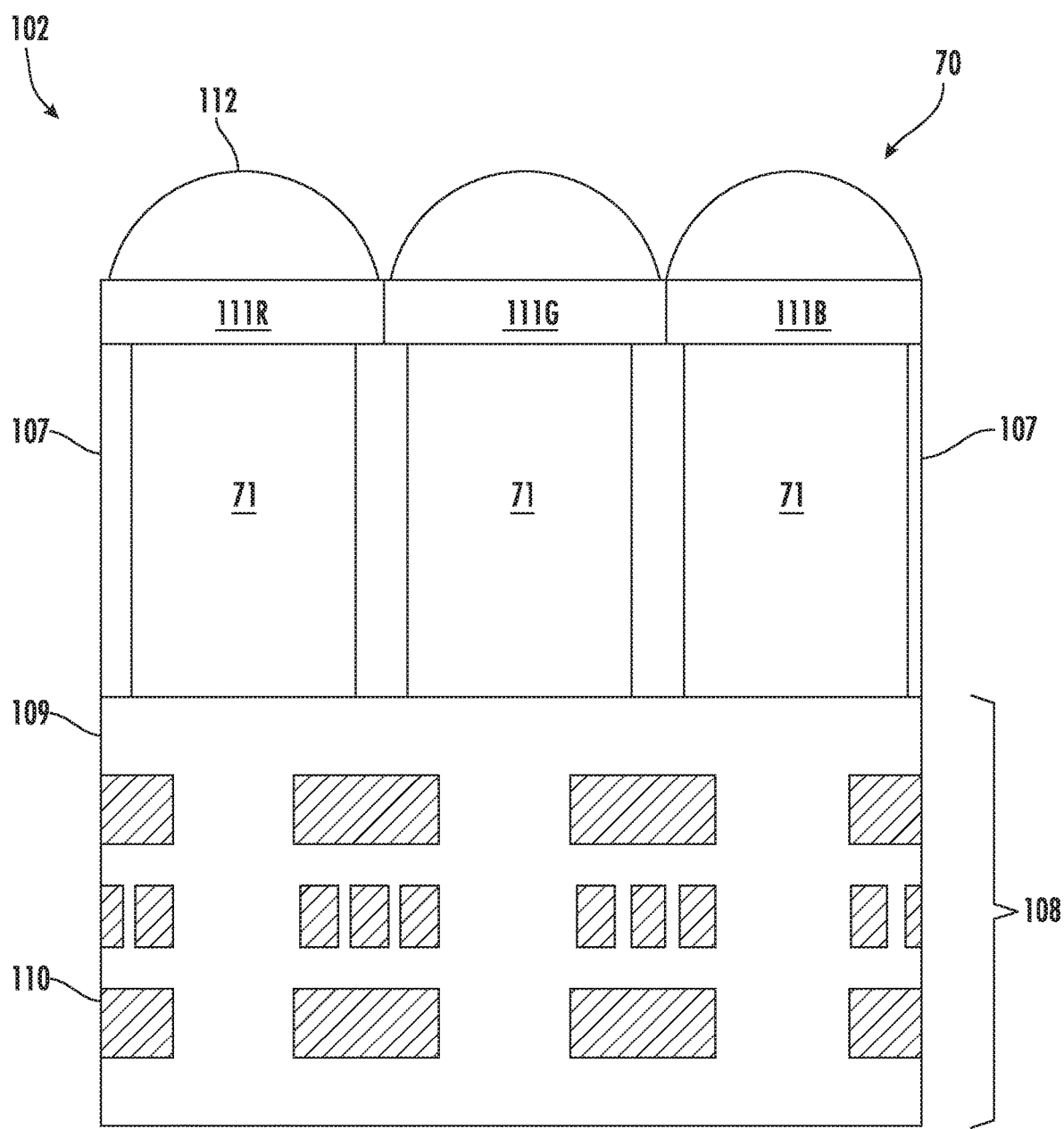
FIG. 10 is a schematic cross-sectional diagram of a back side illumination (BSI) image sensor array in which the pixel of FIG. 5 may be incorporated.

A first example image sensor pixel array 102 in which the pixel 70 may be incorporated is shown in FIG. 10. In the illustrated example, the array 102 is a BSI configuration which illustratively includes a plurality of the photodiodes 71 with insulating regions 107 therebetween. Furthermore, an electrical interconnect layer 108 is beneath the array of image sensor pixels 102 in the illustrated BSI configuration. The electrical interconnect layer 108 illustratively includes a semiconductor layer 109 (e.g., polysilicon) and a plurality of spaced apart conductive (e.g., metal) traces 110 electrically connected to the array of image sensor pixels 102. Furthermore, respective color filters 111R (red), 111G (green), or 111B (blue) are formed or positioned over each of the photodiodes 71, and a respective microlens 112 may also be positioned or formed over each of the color filters. Different color filter and microlens configurations may also be used in different embodiments (e.g., e.g., all IR filters may be used for a night vision sensor)

In another example implementation now described with reference to FIG. 11, the pixel 70' may also be incorporated in an FSI image sensor pixel array 102'. In the illustrated example, the array 102' illustratively includes a plurality of the photodiodes 71'. However, the electrical interconnect layer 108' is above the array of image sensor pixels 102' in the illustrated FSI configuration. That is, the electrical interconnect layer 108' is positioned between the color filters 111R', 111G, 111B' and the photodiodes 71'. Here again, the electrical interconnect layer 108' illustratively includes a semiconductor layer 109' (e.g., polysilicon) and a plurality of spaced apart conductive (e.g., metal) traces 110' electrically connected to the array of image sensor pixels 102. Respective microlenses 112' may also be positioned over each of the color filters 111R', 111G, 111B'. Here again, different filter and lens configurations may also be used in different embodiments.

Further details on example FSI active pixel sensor arrays in which the pixel 70 may be used may be found in co-pending applications U.S. patent application Ser. Nos. 15/843,136, 15/843,121, 15/843,106, and 15/843,044, filed Dec. 15, 2017, which are assigned to the present Applicant and are hereby incorporated herein in their entireties by reference. Moreover, further details on example BSI active pixel sensor arrays in which the pixel 70 may be used may be found in co-pending applications U.S. patent application Ser. Nos. 15/843,017, 15/842,993, 15/842,990 and 15/842,981, filed Dec. 15, 2017, which are assigned to the present Applicant and are hereby incorporated herein in their entireties by reference.

A method for making a CMOS image sensor may include forming an active pixel sensor array (such as the array 120 or 130) including a plurality of pixels 70. As noted above, each pixel may include a photodiode 71 and read circuitry 73 coupled to the photodiode and including a plurality of transistors, such as the transistors 80, 80', defining the 4T cell arrangement.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. A CMOS image sensor comprising:
   an active pixel sensor array comprising a plurality of pixels, each pixel comprising
   a photodiode, and
   read circuitry coupled to the photodiode and comprising a plurality of transistors defining a 4T cell arrangement, each of the transistors comprising
   a first semiconductor layer,
   a superlattice on the first semiconductor layer comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions,
   a second semiconductor layer on the superlattice,
   spaced apart source and drain regions in the second semiconductor layer defining a channel therebetween, and
   a gate comprising a gate insulating layer on the second semiconductor layer and a gate electrode on the gate insulating layer,
   wherein at least one of the transistors comprises a transfer gate transistor comprising a negative gate bias implant in the first semiconductor layer adjacent the drain region thereof.

2. The CMOS image sensor of claim 1 wherein at least one of the transistors comprises a source-follower transistor.

3. The CMOS image sensor of claim 1 wherein at least one of the transistors comprises a reset transistor.

4. The CMOS image sensor of claim 1 wherein at least one of the transistors comprises a selection transistor.

5. The CMOS image sensor of claim 1 wherein the active pixel sensor array comprises a back side illumination (BSI) active pixel sensor array.

6. The CMOS image sensor of claim 1 wherein the active pixel sensor array comprises a front side illumination (FSI) active pixel sensor array.

7. The CMOS image sensor of claim 1 further comprising a respective microlens overlying each of the pixels.

8. The CMOS image sensor of claim 1 further comprising a respective color filter overlying each of the pixels.

9. The CMOS image sensor of claim 1 wherein the at least one non-semiconductor monolayer comprises oxygen.

10. The CMOS image sensor of claim 1 wherein the semiconductor monolayers comprise silicon.

11. A CMOS image sensor comprising:
    an active pixel sensor array comprising a plurality of pixels, each pixel comprising
    a photodiode, and
    a four transistor (4T) cell coupled to the photodiode and comprising a transfer gate transistor, a reset transistor, a source-follower transistor, and a selection transistor, and each of the transistors comprising
    a first semiconductor layer,
    a superlattice on the first semiconductor layer comprising a plurality of stacked groups of layers, each group of layers comprising a plurality of stacked base semiconductor monolayers defining a base semiconductor portion, and at least one non-semiconductor monolayer constrained within a crystal lattice of adjacent base semiconductor portions,
    a second semiconductor layer on the superlattice,
    spaced apart source and drain regions in the second semiconductor layer defining a channel therebetween, and
    a gate comprising a gate insulating layer on the second semiconductor layer and a gate electrode on the gate insulating layer,
    wherein the transfer gate transistor comprises a negative gate bias implant in the first semiconductor layer adjacent the drain region thereof.

12. The CMOS image sensor of claim 11 wherein the active pixel sensor array comprises a back side illumination (BSI) active pixel sensor array.

13. The CMOS image sensor of claim 11 wherein the active pixel sensor array comprises a front side illumination (FSI) active pixel sensor array.

14. A CMOS image sensor comprising:
    an active pixel sensor array comprising a plurality of pixels, each pixel comprising
    a photodiode, and
    read circuitry coupled to the photodiode and comprising a plurality of transistors defining a 4T cell arrangement, each of the transistors comprising
    a first semiconductor layer,
    a superlattice on the first semiconductor layer comprising a plurality of stacked groups of layers, each group of layers comprising a plurality of stacked base silicon monolayers defining a base silicon portion, and at least one oxygen monolayer constrained within a crystal lattice of adjacent base silicon portions,
    a second semiconductor layer on the superlattice,
    spaced apart source and drain regions in the second semiconductor layer defining a channel therebetween, and a gate comprising a gate insulating layer on the second semiconductor layer and a gate electrode on the gate insulating layer,
wherein at least one of the transistors comprises a transfer gate transistor comprising a negative gate bias implant in the first semiconductor layer adjacent the drain region thereof.

15. The CMOS image sensor of claim 14 wherein at least one of the transistors comprises a source-follower transistor.

16. The CMOS image sensor of claim 14 wherein at least one of the transistors comprises a reset transistor.

17. The CMOS image sensor of claim 14 wherein at least one of the transistors comprises a selection transistor.

* * * * *